(12) United States Patent
Ehberger et al.

(10) Patent No.: US 12,308,203 B2
(45) Date of Patent: May 20, 2025

(54) METHODS OF DETERMINING ABERRATIONS OF A CHARGED PARTICLE BEAM, AND CHARGED PARTICLE BEAM SYSTEM

(71) Applicant: ICT Integrated Circuit Testing Gesellschaft für Halbleiterprüftechnik mbH, Heimstetten (DE)

(72) Inventors: Dominik Ehberger, Ebersberg (DE); John Breuer, Munich (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 628 days.

(21) Appl. No.: 17/730,916

(22) Filed: Apr. 27, 2022

(65) Prior Publication Data

US 2023/0352268 A1    Nov. 2, 2023

(51) Int. Cl.
| | |
|---|---|
| *H01J 37/21* | (2006.01) |
| *H01J 37/22* | (2006.01) |
| *H01J 37/244* | (2006.01) |

(52) U.S. Cl.
CPC ............ *H01J 37/21* (2013.01); *H01J 37/222* (2013.01); *H01J 37/244* (2013.01); *H01J 2237/1534* (2013.01)

(58) Field of Classification Search
CPC ...... H01J 37/222; H01J 37/244; H01J 37/153; H01J 37/21; H01J 2237/1534; H01J 2237/282

See application file for complete search history.

(56) References Cited

U.S. PATENT DOCUMENTS

2023/0116466 A1* 4/2023 Ehberger .............. H01J 37/263
250/310

FOREIGN PATENT DOCUMENTS

WO    WO-2021078445 A1 *  4/2021    ............ H01J 37/153

OTHER PUBLICATIONS

Uno, S. et al., "Aberration correction and its automatic control in scanning electron microscopes," Optik Optics—International Journal for Light and Electron Optics, 116(9), 2005, pp. 438-448.

* cited by examiner

Primary Examiner — David E Smith
Assistant Examiner — Hsien C Tsai
(74) Attorney, Agent, or Firm — Kilpatrick Townsend & Stockton LLP

(57) ABSTRACT

A method of determining aberrations of a charged particle beam (11) focused by a focusing lens (120) with a given numerical aperture (NA) toward a sample (10) in a charged particle beam system is described. The method includes: (a.) simulating, based at least on the given numerical aperture (NA), one or more beam cross sections at one or more first defocus settings for each of two or more different values of a first beam aberration coefficient ($C_1$) of a set of beam aberration coefficients ($C_{1...n}$), to provide a plurality of first simulated beam cross sections; (b.) extracting two or more values of a first aberration characteristic ($\tilde{C}_1$) that is related to the first beam aberration coefficient ($C_1$) from the plurality of first simulated beam cross sections; (c.) determining a first dependency between the first beam aberration coefficient ($C_1$) and the first aberration characteristic ($\tilde{C}_1$); (d.) taking one or more images of the sample at the one or more first defocus settings or at one or more second defocus settings, to provide one or more taken images, and retrieving one or more retrieved beam cross sections from the one or more taken images; (e.) extracting a retrieved value of the first aberration characteristic from the one or more retrieved beam cross sections; and (f.) determining an actual value of the first beam aberration coefficient based on the first dependency and based on the retrieved value of the first aberration characteristic.

21 Claims, 3 Drawing Sheets

METHODS OF DETERMINING ABERRATIONS OF A CHARGED PARTICLE BEAM, AND CHARGED PARTICLE BEAM SYSTEM

TECHNICAL FIELD

Embodiments described herein relate to methods of determining aberrations of a charged particle beam in a charged particle beam system, for example in an electron microscope, particularly in a scanning electron microscope (SEM). Specifically, actual values of one or more beam aberration coefficients can be determined, facilitating the correction of the beam aberrations and improving the resolution. More specifically, embodiments described herein relate to methods of determining beam aberration coefficients of a charged particle beam focused by a focusing lens with a given numerical aperture toward a sample in a charged particle beam system, which facilitates the provision of an aberration-corrected charged particle beam. Embodiments further relate to charged particle beam systems for inspecting and/or imaging a sample that is configured for any of the methods described herein.

BACKGROUND

Modern semiconductor technology has created a high demand for structuring and probing specimens in the nanometer or even in the sub-nanometer scale. Micrometer and nanometer-scale process control, inspection or structuring, is often done with charged particle beams, e.g. electron beams, which are generated, shaped, deflected and focused in charged particle beam systems, such as electron microscopes or electron beam pattern generators. For inspection purposes, charged particle beams offer a superior spatial resolution compared to, e.g., photon beams.

Inspection apparatuses using charged particle beams such as scanning electron microscopes (SEM) have many functions in a plurality of industrial fields, including, but not limited to, inspection of electronic circuits, exposure systems for lithography, detecting systems, defect inspection tools, and testing systems for integrated circuits. In such particle beam systems, fine beam probes with a high current density can be used. For instance, in the case of an SEM, the primary electron beam generates signal particles like secondary electrons (SE) and/or backscattered electrons (BSE) that can be used to image and/or inspect a sample.

Reliably inspecting and/or imaging samples with a charged particle beam system at a good resolution is, however, challenging because the charged particle beam typically suffers from beam aberrations that limit the obtainable resolution. In typical charged particle beam systems, aberration correctors are provided for at least partially compensating aberrations of the charged particle beam, such as spherical aberrations, astigmatism, and/or chromatic aberrations. An aberration-corrected charged particle beam can provide a smaller probe focus and hence a better resolution as compared to an uncorrected beam. However, it is challenging to appropriately adjust the settings of aberration correctors, which may have a large number of controls, such as to correct the beam aberrations satisfactorily, the reason being that the beam aberration that is present in the system is generally unknown.

Several methods for determining or correcting aberrations of a charged particle beam in electron microscopes have been described. For example, Uno et al. in "*Aberration correction and its automatic control in scanning electron microscopes*" (Optik—International Journal for Light and Electron Optics, 116(9) (2005) 438-448), hereinafter referred to as "UNO", describes a method of determining dependencies between so-called "digitized aberrations" and field strengths of a specific multi-stage aberration corrector suitable for compensating such "digitized aberrations". However, the aberration correction method of UNO is time-consuming, because a plurality of measurements has to be carried out for determining the mentioned dependencies, and the use of the determined dependencies is then limited to one specific multi-stage aberration corrector that is adapted for generating the respective field strengths.

In view of the above, it would be beneficial to provide methods of quickly and reliably determining aberrations of a charged particle beam focused by a focusing lens in a charged particle beam system, in particular for determining the actual values of beam aberration coefficients, i.e. the beam aberration coefficients in absolute values. Further, it would be beneficial to provide a charged particle beam system for inspecting and/or imaging a sample that is configured for being operated in accordance with any of the methods described herein. The determined actual aberration values can be used, for example, for correcting the charged particle beam and/or for examining the spot shape of the actual charged particle beam, e.g. for comparing performances between different charged particle beam tools.

SUMMARY

In light of the above, methods of determining beam aberrations of a charged particle beam and charged particle beam systems configured to determine beam aberrations of a charged particle beam are provided according to the independent claims.

According to one aspect, a method of determining aberrations of a charged particle beam focused by a focusing lens with a given numerical aperture toward a sample in a charged particle beam system is provided. The method includes: (a.) simulating, based at least on the given numerical aperture, one or more beam cross sections at one or more first defocus settings for each of two or more different values of a first beam aberration coefficient of a set of beam aberration coefficients, to provide a plurality of first simulated beam cross sections; (b.) extracting two or more values of a first aberration characteristic that is related to the first beam aberration coefficient from the plurality of first simulated beam cross sections; (c.) determining a first dependency between the first beam aberration coefficient and the first aberration characteristic; (d.) taking one or more images of the sample at the one or more first defocus settings or at one or more second defocus settings, to provide one or more taken images, and retrieving one or more retrieved beam cross sections from the one or more taken images; (e.) extracting a retrieved value of the first aberration characteristic from the one or more retrieved beam cross sections; and (f) determining an actual value of the first beam aberration coefficient based on the first dependency and based on the retrieved value of the first aberration characteristic.

According to an aspect, a method of determining aberrations of a charged particle beam focused by a focusing lens with a given numerical aperture toward a sample in a charged particle beam system is provided. The method includes: (a.) simulating, based at least on the given numerical aperture, one or more beam cross sections at one or more first defocus settings for each of two or more different values of a first beam aberration coefficient of a set of beam aberration coefficients, to provide a plurality of first simulated beam cross sections; (b.) extracting two or more values of a first aberration characteristic that is related to the first beam aberration coefficient from the plurality of first simulated beam cross sections; and (c.) determining a first dependency between the first beam aberration coefficient and the first aberration characteristic for use in determining an actual value of the first beam aberration coefficient in the charged particle beam focused with the given numerical aperture toward the sample. In particular, the first dependency may be determined and may then be stored in a memory that is associated to a processing unit of the charged particle beam system, for use in a subsequent determination of the actual value of the first beam aberration coefficient.

In some embodiments, the one or more first defocus settings include one or more defocus distances from a respective beam focus of the charged particle beam, particularly a pair of defocus distances including an underfocus distance and a corresponding overfocus distance, at which the one or more beam cross sections are simulated in (a.) and/or at which the one or more images are taken in (d.). Alternatively or additionally, the one or more first defocus settings include one or more beam landing energies of the charged particle beam varied from a focus beam landing energy, at which the one or more beam cross sections are simulated in (a.) and/or at which the one or more images are taken in (d.).

According to one aspect, a charged particle beam system for imaging and/or inspecting a sample with a charged particle beam, particularly with an electron beam, is provided. The charged particle beam system includes a charged particle source for emitting a charged particle beam propagating along an optical axis; a sample stage; a focusing lens for focusing the charged particle beam toward a sample placed on the sample stage with a given numerical aperture; a charged particle detector for detecting signal particles emitted from the sample; and a processing unit and a memory storing a first dependency between a first beam aberration coefficient and a first aberration characteristic, the first aberration characteristic being a parameter that is extractable from one or more defocus beam cross-sections and that has a predetermined relation to the first beam aberration coefficient.

According to one aspect, a charged particle beam system configured to focus a charged particle beam with a given numerical aperture toward a sample is described, particularly in accordance with the previous aspect. The charged particle beam system includes a simulation unit configured (i) to simulate one or more beam cross sections at one or more defocus settings for each of two or more different values of a first beam aberration coefficient to provide a plurality of first simulated beam cross sections, (ii) to extract two or more values of the first aberration characteristic from the plurality of first simulated beam cross sections, and (iii) to determine the first dependency between the first beam aberration coefficient and the first aberration characteristic for use in determining an actual value of the first beam aberration coefficient in the charged particle beam focused with the given numerical aperture toward the sample. The determined first dependency may optionally be stored in a memory. The charged particle beam system may further include any of the features of the charged particle beam systems described herein and/or may be configured for conducting any of the methods described herein.

Embodiments are also directed at apparatuses for carrying out the disclosed methods and include apparatus parts for performing the individual method actions. The method may be performed by way of hardware parts, a computer programmed by appropriate software, by any combination of the two or in any other manner. Furthermore, embodiments are also directed at methods of operating the described apparatuses.

Further advantages, features, aspects and details that can be combined with embodiments described herein are evident from the dependent claims, the description and the drawings.

BRIEF DESCRIPTION OF THE DRAWINGS

So that the manner in which the above recited features of the present disclosure can be understood in detail, a more particular description, briefly summarized above, may be had by reference to embodiments. The accompanying drawings relate to one or more embodiments and are described in the following.

DETAILED DESCRIPTION

Reference will now be made in detail to the various embodiments, one or more examples of which are illustrated in the figures. Within the following description of the drawings, same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Figure 1:
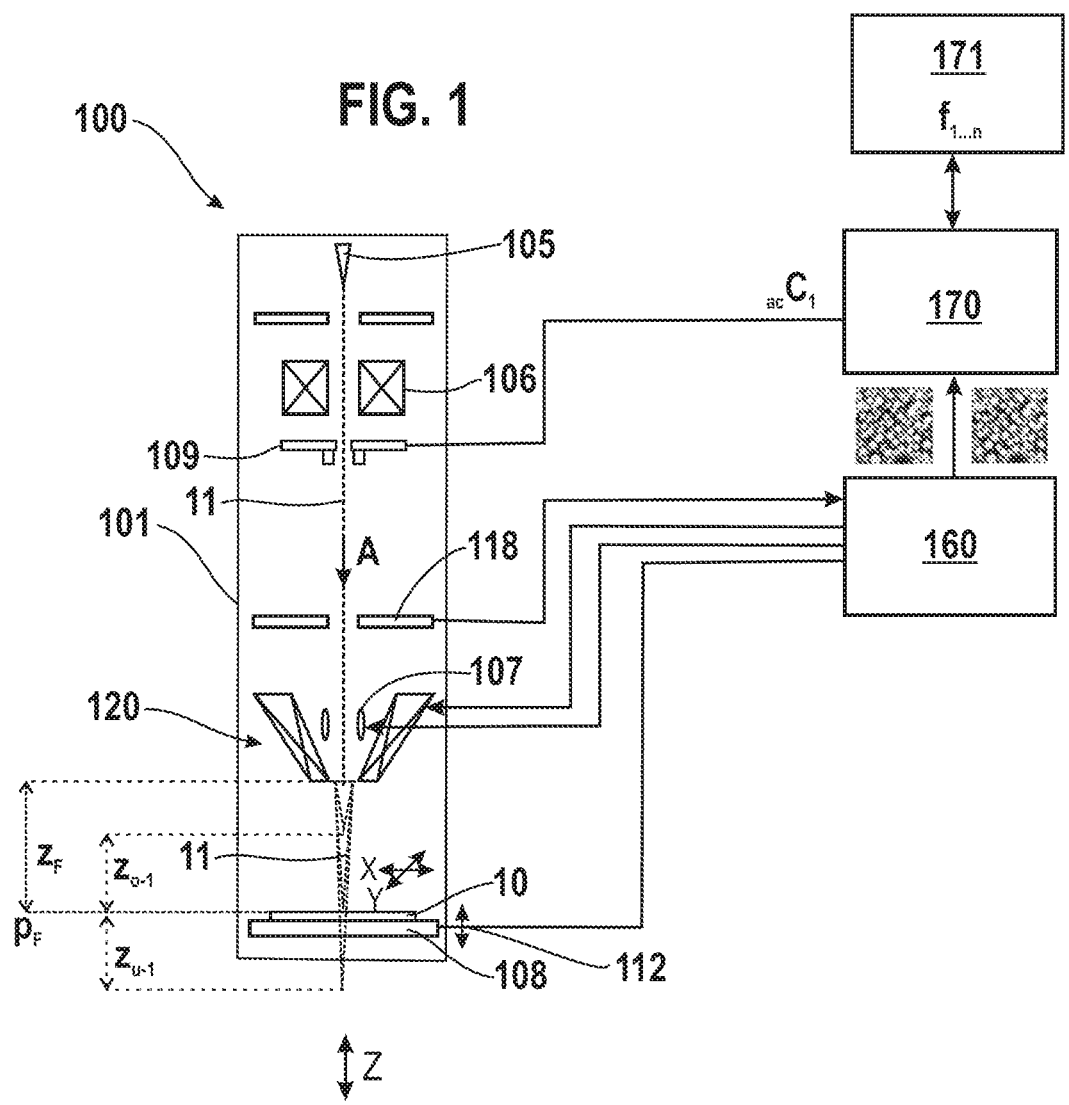
FIG. 1 shows a schematic view of a charged particle beam system according to embodiments described herein that is adapted for being operated according to any of the methods described herein.

FIG. 1 is a schematic view of a charged particle beam system 100 for inspecting and/or imaging a sample 10 according to embodiments described herein. The charged particle beam system 100 includes a charged particle source 105, particularly an electron source, for emitting a charged particle beam 11, particularly an electron beam, propagating along an optical axis A. The charged particle beam system 100 further includes a sample stage 108, and a focusing lens 120, particularly an objective lens, for focusing the charged particle beam 11 on the sample 10 that is placed on the sample stage 108. The charged particle beam system 100 further includes a charged particle detector 118, particularly an electron detector, for detecting signal particles (particularly secondary electrons and/or backscattered electrons) emitted from the sample 10.

An image generation unit 160 may be provided that is configured to generate one or more images of the sample 10 based on the charged particle signal received from the charged particle detector 118. The image generation unit 160 can forward the one or more images of the sample to a processing unit 170 that is configured to determine actual values of beam aberration coefficients therefrom in accordance with the methods described herein.

The sample stage 108 may be a movable stage. In particular, the sample stage 108 may be movable in the Z-direction, i.e., in the direction of the optical axis A, such that the distance between the focusing lens 120 and the sample stage 108 can be varied (see arrow 112 in FIG. 1). By moving the sample stage 108 in the Z-direction, the sample can be moved to different "defocus distances" away from a focal plane $p_F$ of the focusing lens 120 such that out-of-focus images of the sample 10 can be taken by a respective stage movement, e.g. in increments of, e.g. 0.1 μm or more and/or 2 μm or less. In some embodiments, the sample stage 108 may also be movable in a plane perpendicular to the optical axis A (also referred to herein as the X-Y-plane). By moving the sample stage 108 in the X-Y-plane, a specified surface region of the sample 10 can be moved into an area below the focusing lens 120, such that the specified surface region can be imaged by focusing the charged particle beam 11 thereon.

The beam-optical components of the charged particle beam system 100 are typically placed in a vacuum chamber 101 that can be evacuated, such that the charged particle beam 11 can propagate along the optical axis A from the charged particle source 105 toward the sample stage 108 and hit the sample 10 under a sub-atmospheric pressure, e.g. a pressure below $10^{-3}$ mbar or a pressure below $10^{-5}$ mbar.

In some embodiments, the charged particle beam system 100 may be an electron microscope, particularly a scanning electron microscope. A scan deflector 107 may be provided for scanning the charged particle beam 11 over a surface of the sample 10 along a predetermined scanning pattern, e.g., in the X-direction and/or in the Y-direction.

In some embodiments, a condenser lens system 106 may be arranged downstream of the charged particle source 105, particularly for collimating the charged particle beam 11 propagating toward the focusing lens 120. In some embodiments, the focusing lens 120 is an objective lens configured to focus the charged particle beam 11 on the sample 10, particularly a magnetic objective lens, an electrostatic magnetic lens, or a combined magnetic-electrostatic lens.

One or more surface regions of the sample 10 can be inspected and/or imaged with the charged particle beam system 100. The term "sample" as used herein may relate to a substrate, e.g., with one or more layers or features formed thereon, a semiconductor wafer, a glass substrate, a flexible substrate, such as a web substrate, or another sample that is to be inspected. The sample can be inspected for one or more of (1) imaging a surface of the sample, (2) measuring dimensions of one or more features of the sample, e.g. in a lateral direction, i.e. in the X-Y-plane, (3) conducting critical dimension measurements and/or metrology, (4) detecting defects, and/or (5) investigating the quality of the sample.

For inspecting the sample 10 with the charged particle beam 11, the charged particle beam 11 is typically focused on a sample surface with the focusing lens 120. Secondary electrons and/or backscattered electrons (referred to as "signal electrons") are emitted from the sample when the charged particle beam 11 impinges on the sample surface. The signal electrons provide information about spatial characteristics and dimensions of features of the sample and can be detected with the charged particle detector 118. By scanning the charged particle beam 11 over the sample surface, e.g. with the scan deflectors 107, and detecting the signal electrons as a function of the generation position of the signal electrons, the sample surface or a portion thereof can be imaged, e.g., with the image generation unit 160 that may be configured to provide an image of the sample 10 based on the received signal electrons.

A small spot of the focused charged particle beam 11 on the sample surface increases the obtainable image resolution. Accordingly, the sample surface should be arranged in the focal plane $p_F$ of the focusing lens 120 during the inspection, in order to obtain a sharp in-focus image of the sample 10. A sharp image of the sample 10 taken in-focus is also referred to herein as a "focus image $h_F$", the subscript F designating "Focus", whereas an image taken out-of-focus is referred to herein as a defocus image, such as an over-focused image $h_{o-1}$ taken behind the beam focus or an under-focused image $h_{u-1}$ taken in front of the beam focus. Similarly, the beam cross section of the charged particle beam 11 in the focal plane $p_F$ is referred to herein as a "focus beam cross section $g_F$", whereas the beam cross section out of focus is referred to herein as a defocus beam cross section, such as an over-focused beam cross section $g_{o-1}$ behind the beam focus or an under-focused beam cross section $g_{u-1}$ in front of the beam focus.

Notably, an image can be mathematically presented in real space (=in the image domain, i.e. as a function of the spatial coordinates) or in Fourier space (=in the frequency domain, i.e. as a function of spatial frequency). An image in Fourier space can be calculated from an image in real space via a Fourier transformation (FT). Both above representations contain corresponding information of the image. As used herein, images in real space are designated with the small letter "$h_n$" and images in Fourier space are designated by the capital letter "$H_n$". For example, while "$h_F$" designates the focus image of the sample in real space, "$H_F$" designates the focus image of the sample in Fourier space, which is a Fourier transform of $h_F$. Similarly, beam cross sections in real space are designated herein with the small letter "$g_n$", and beam cross sections in Fourier space are designated herein by the capital letter "$G_n$". For example, while "$g_F$" designates the focus beam cross section of the charged particle beam in real space, "$G_F$" designates the focus beam cross section of the charged particle beam in Fourier space, which is a Fourier transform of $g_F$. Images and beam cross sections in real space can be Fourier transformed into Fourier space, and vice versa, via a fast Fourier transform (FFT) algorithm in some of the embodiments described herein.

In charged particle beam systems, beam aberrations typically lead to an enlarged or deformed beam cross section, which reduces the achievable resolution. For example, spherical aberrations in the system which are typically introduced by lenses lead to an enlarged focus beam cross section in the focal plane $p_F$, and astigmatism may lead to different foci for rays propagating in different planes, which blurs the image.

Different types of beam aberrations may be present in a charged particle beam system and may need correction, such as, for example, (1) spherical aberration (quantitatively expressed by the beam aberration coefficient $C_{3,0}$ or $C_s$), (2) defocus (quantitatively expressed by the beam aberration coefficient $C_{df}$), (3) astigmatism of the $1^{st}$ order (quantitatively expressed by the beam aberration coefficient $A_1$), (4) astigmatism of the $2^{nd}$ order (quantitatively expressed by the beam aberration coefficient $A_2$), (5) astigmatism of the $3^{rd}$ order (quantitatively expressed by the beam aberration coefficient $A_3$), (6) coma (quantitatively expressed by the beam aberration coefficient $B_2$), (7) star aberration (quantitatively expressed by the beam aberration coefficient $S_3$).

Further, a plurality of chromatic aberrations may be present, depending on the energy spread of the charged particle beam and on the dispersion of the beam-optical components of the system, which can be quantitatively expressed by one or more chromatic aberration coefficients. A set of beam aberration coefficients $C_{1...n}$ may include two, three or more of the above beam aberration coefficients, for example $C_{1...n}=[C_{df}, C_s, A_1, A_2]$. The absolute values of the beam aberration coefficients of the set of beam aberration coefficients $C_{1...n}$ may be determined for the actual charged particle beam that is present in the charged particle beam system according to embodiments and methods described herein, such that the beam aberrations can be compensated with one or more beam aberration correctors that are adjusted in accordance with the determined absolute values.

Beam aberrations can be corrected with aberration correctors, for example with electrostatic or magnetic multipole correctors. An aberration corrector 109 is schematically depicted in FIG. 1, but it is to be understood that the charged particle beam system may also include two or more aberration correctors that are not necessarily provided at one position along the optical axis A. For example, a stigmator including a quadrupole may be provided for correcting $1_{st}$-order astigmatism $A_1$, and/or higher order multipoles may be provided for correcting higher-order astigmatism $A_2$ and/or $A_3$. Further correctors may be provided for compensating spherical aberration $C_s$. Various types of aberration correctors for correcting various beam aberrations coefficients are known.

It is challenging to adjust an aberration corrector such that one or more types of beam aberration are appropriately corrected, the reason being that the amount of beam aberration that is present in the system is generally unknown. It is possible to set one or more aberration correctors such that pre-calculated beam aberrations that are theoretically introduced by the beam-optical components of the system are compensated, but such an approach is typically not sufficiently accurate. Specifically, not all the sources of beam aberrations are known, in particular quantitatively. For example, beam aberrations may also be introduced by inaccuracies of the system, such as mechanical, magnetic or electrostatic inaccuracies, charge contamination, material inhomogeneities, fabrication imperfections, which are not initially known. Beam-optical components may include one or more of an objective lens, a collimator, a deflector, a scan deflector, a beam separator, a charged particle detector, and an aberration corrector.

Various methods can be used for estimating beam aberrations in a charged particle beam system, such that the beam aberrations can be at least partially corrected. Some methods rely on the visible inspection of the charged particle beam, e.g. in the far-field, which may give an indication of aberrations that are present in the system. Other methods rely on the analysis of taken images. An image that is taken out of focus yields information about the respective beam cross section (i.e., the probe shape) out of focus, and the probe shape out of focus can give qualitative information about specific types of beam aberrations. For example, astigmatic beams are typically non-rotationally symmetric, in particular at positions distant from the beam focus. Methods rely on the extraction of line profiles from a defocus beam cross section, and beam aberrations can be estimated from such line profiles.

UNO describes in sections 6 and 6.1 the extraction of beam cross sections (i.e., probe shapes) from images taken out of focus and in section 6.2 the determination of "digitized aberrations" from under-focused and over-focused probe shapes. The digitized aberrations can be retrieved from over-focused and under-focused beam cross sections and can be defined for different beam aberrations, see formulas (38)-(47) of UNO. UNO is incorporated herein by reference, particularly with respect to the determination of "digitized aberrations" (herein referred to as "aberration characteristics") from defocus beam cross sections and with respect to the determination of defocus beam cross sections (in particular, under-focused and over-focused beam cross sections) from images taken out of focus (UNO, chapter 6).

According to UNO, a plurality of measurements is carried out for determining dependencies between the digitized aberrations and correction fields applied by a specific beam aberration corrector. The determined dependencies are then related to a specific multi-stage aberration corrector that is adapted for generating the respective field strengths, which makes the method of UNO time consuming and its field of application limited.

The above concepts allow only for relative estimates of aberrations, whereas no absolute values of aberration coefficients can be retrieved. "Absolute values" of beam aberration coefficients may be understood as the actual quantitative values of the beam aberration coefficients, such as $C_s$ expressed in [mm], which values directly allow an appropriate setting of an aberration corrector based on the determined absolute values of the beam aberration coefficients. Notably, previously known methods typically only enable relative estimates of beam aberrations that may vary from measurement to measurement and/or that relate to the specific correction fields generated by a specific aberration corrector.

Methods described herein allow for the accurate and reliable determination of actual values of beam aberration coefficients quantitatively describing the beam aberrations of a charged particle beam. In some embodiments, the actual values of the beam aberration coefficients may be determined with a processing unit 170 and can then be directly forwarded to the aberration corrector 109, such that the aberration corrector 109 can compensate one or more of the beam aberrations, and an aberration-compensated charged particle beam can be provided.

The methods described herein use a calibration that is based on simulations of beam profiles out-of-focus at predetermined defocus settings for determining dependencies between the beam aberration coefficients and corresponding aberration characteristics. For example, a first calibration based on simulations determines a first dependency $f_1$ between a first beam aberration coefficient $C_1$ (in absolute values) and a corresponding first aberration characteristic $\sim C_1$. The first dependency $f_1$ may optionally be stored in a memory 171 of the charged particle beam system, such that the calibration may be directly available and can be used for quickly converting a value of the first aberration characteristic retrieved from one or more defocus images into an actual value of the first aberration coefficient (expressed in absolute values, such as to be usable for aberration correction in the aberration corrector). It will be explained in the following, how the dependencies $f_{1...n}$ between the beam aberration coefficients and the respective aberration characteristics are determined in accordance with the methods described herein.

Figure 2:
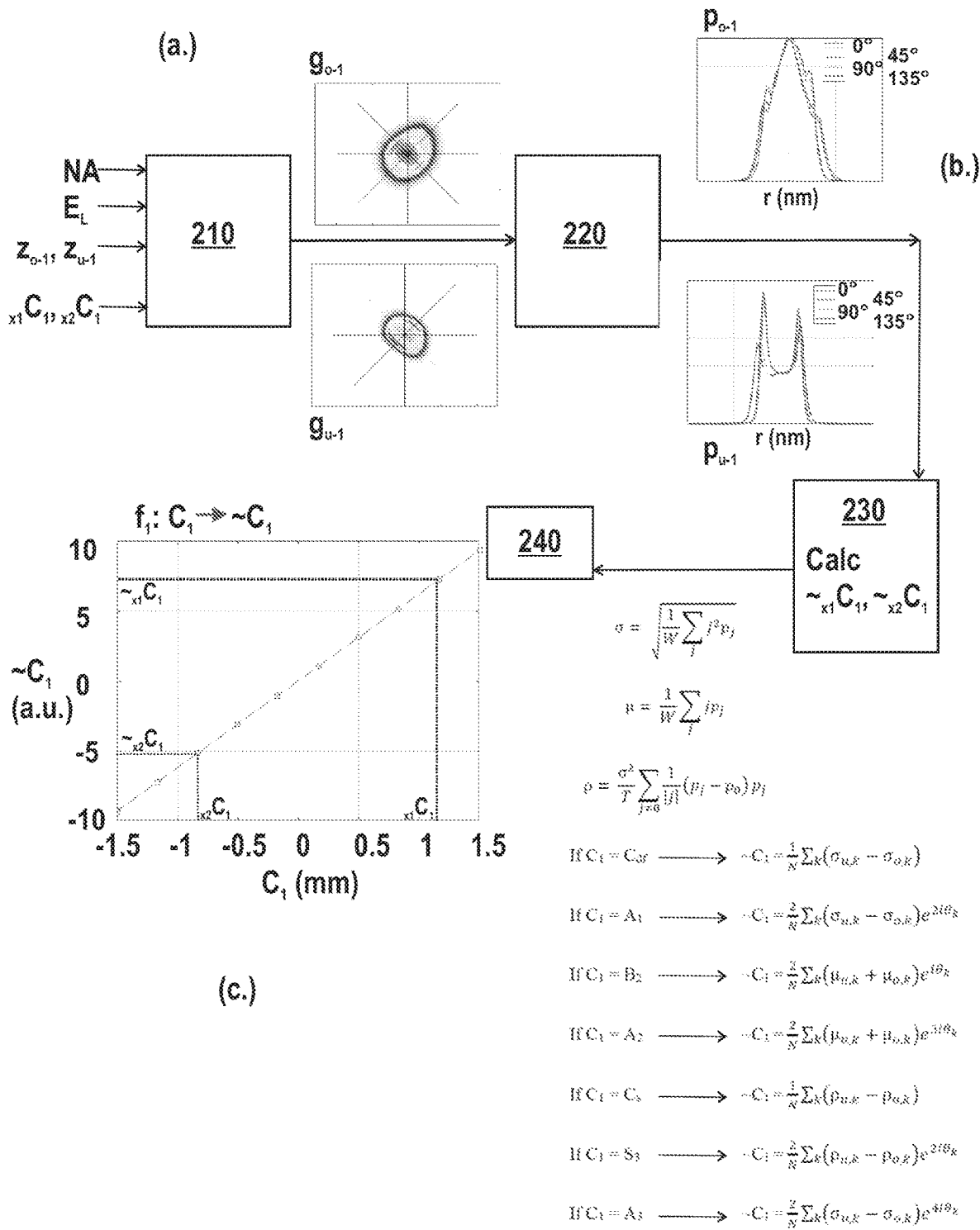
FIG. 2 shows a diagram illustrating a method of determining a first dependency ($f_1$) between an aberration coefficient and the corresponding aberration characteristic for use in determining aberrations of a charged particle beam according to embodiments described herein.

FIG. 2 shows a diagram illustrating a method of determining, in an exemplary way, the first dependency $f_1$ between the first aberration coefficient $C_1$ (here: $C_1=C_s$, i.e. the spherical aberration coefficient) and the corresponding first aberration characteristic $\sim C_1$ for use in determining aberrations (here: spherical aberrations in absolute values, expressed by the actual value of the spherical beam aberration coefficient $C_s$) of a charged particle beam. It is noted that, for illustration purposes, the beam cross sections illustrated in FIG. 2 were simulated with further non-zero beam aberration coefficients, such as with non-zero astigmatism, such that the beam cross sections are not rotationally symmetric and the radial line profiles $p_{o-1}$ and $p_{u-1}$ depend on the azimuthal angle, respectively. However, the skilled person will appreciate that embodiments described herein encompass the simulation, in stage (a.), of beam cross sections with only one non-zero aberration coefficient (e.g., $C_s \neq 0$), respectively, or alternatively of beam cross sections with several non-zero aberration coefficients (e.g., $C_s \neq 0$ and $A_1 \neq 0$), respectively.

In box 210, one or more beam cross sections ($g_{o-1}$, $g_{u-1}$) are simulated (stage (a.)) at one or more first defocus settings for each of two or more different values ($_{x1}C_1$, $_{x2}C_1$) of the first beam aberration coefficient $C_1$ to provide a plurality of simulated beam cross sections ($g_{o-1}$, $g_{u-1}$). The two or more different values of the first beam aberration coefficient can be arbitrarily chosen (for example, $_{x1}C_1 = -0.8$ mm and $_{x2}C_1 = +1.2$ mm in the example of FIG. 2), e.g., a negative value and a positive value corresponding to a charged particle beam with negative and positive spherical aberration, particularly from the range of values of typical uncorrected systems.

The simulation may be conducted for a given value of the numerical aperture (NA) of the charged particle beam, the numerical aperture (NA) in the simulation substantially corresponding to the numerical aperture (NA) of the actual charged particle beam system whose aberrations are to be determined. The numerical aperture (NA) is a dimensional number known to the skilled person that characterizes the divergence of the charged particle beam toward the beam focus that is provided by the focusing lens 120. Values of aberration characteristics determined at specific defocus settings may depend on the numerical aperture, i.e., on the beam divergence toward the beam focus, such that it is beneficial to conduct the simulations using the numerical aperture (NA) of the actual charged particle beam system.

In some embodiments, the simulation may be conducted for a given value of the beam landing energy $E_L$ of the charged particles of the charged particle beam on the sample, the beam landing energy $E_L$ used in the simulation corresponding to the beam landing energy $E_L$ of the charged particle beam of the actual charged particle beam system whose aberrations are to be determined. The beam landing energy may correspond to the (average) energy of electrons impinging on the sample and may be expressed in eV. Values of aberration characteristics determined at specific defocus settings may depend on the charged particle energy, such that it may be beneficial to conduct the simulations using the beam landing energy $E_L$ of the actual charged particle beam system.

In some embodiments, the one or more first defocus settings may include one or more defocus distances ($z_{o-1}$, $z_{u-1}$) from the beam focus of the charged particle beam, such that the one or more beam cross sections ($g_{o-1}$, $g_{u-1}$) are simulated at the one or more defocus distances ($z_{o-1}$, $z_{u-1}$). Specifically, the beam cross sections are simulated at positions away from the respective beam focus by certain positive and/or negative distances ($z \neq 0$), such that the plurality of first simulated beam cross sections are out-of-focus beam cross sections. If beam aberrations are present in a charged particle beam, such beam aberrations appear much more clearly at defocus distances than in the focal plane, e.g., because the focal spot is very small. Therefore, aberration characteristics can be retrieved more reliably and more accurately from defocus beam cross sections as compared to focus beam cross sections. The one or more defocus distances may include a pair of defocus distances, namely an overfocus distance ($z_{o-1}$) and an underfocus distance ($z_{u-1}$). In other words, the beam cross sections may be simulated on both sides of the beam focus, particularly at a corresponding positive and negative distance from the beam focus, referred to herein as an overfocus distance and an underfocus distance.

In particular, in (a.), an over-focused beam cross section and an under-focused beam cross section may be simulated for each of the two or more different values ($_{x1}C_1$, $_{x2}C_1$) of the first beam aberration coefficient to provide the plurality of first simulated beam cross sections. FIG. 1 exemplarily shows an over-focused beam cross section ($g_{o-1}$) simulated at an overfocus distance ($z_{o-1}$) from the beam focus and an under-focused beam cross section ($g_{u-1}$) simulated at an underfocus distance ($z_{u-1}$) from the beam focus (particularly using a given NA and a given $E_L$, respectively). The illustrated beam cross sections are simulated with the first value ($_{x1}C_1$) of the first beam aberration coefficient, namely with a strong spherical aberration ($C_s > 0$), as can be clearly identified by the differences in the beam profiles of the over-focused and the under-focused beam cross section. As mentioned above, the illustrated beam cross sections were simulated with further non-zero beam aberrations (e.g., $A_1 \neq 0$) for illustration purposes, rendering the beam cross sections of FIG. 2 rotationally asymmetric. Similarly, an over-focused and an under-focused beam cross section are simulated with the second value ($_{x2}C_1$) and optionally with further values of the first beam aberration coefficient different from the first value ($_{x1}C_1$), to provide the plurality of first simulated beam cross sections.

Alternatively or additionally, the one or more first defocus settings may include one or more beam landing energies of the charged particle beam varied from the focus beam landing energy $E_L$. The focus beam landing energy $E_L$ can be understood as the beam landing energy of the actual charged particle beam system which provides a beam focus on the sample, such that the sample is arranged in focus, and a variation away from said focus beam landing energy leads to a defocus setting ("energy defocus"), i.e. a shift of the beam focus into another plane. More specifically, a chromatic aberration of the charged particle beam system translates an energy defocus into a spatial defocus. Therefore, a varied beam landing energy leads to the simulation of a beam cross section in a plane away from the respective focal plane of the charged particle beam, i.e. to the simulation of a defocus beam cross section. Said defocus effect is related to the chromatic aberration(s) of the system. Accordingly, simulating the beam cross sections at the one or more varied beam landing energies is particularly beneficial, if the first beam aberration coefficient is a chromatic beam aberration coefficient, whereas simulating the beam cross section at the one or more defocus distances is particularly beneficial, if the first beam aberration coefficient is a geometric beam aberration coefficient.

In boxes 220 and 230, two or more values ($\sim_{x1}C_1$, $\sim_{x2}C_1$) of a first aberration characteristic $\sim C_1$ that is related to the first beam aberration coefficient $C_1$ are extracted (stage (b.)) from the plurality of first simulated beam cross sections.

"Aberration characteristics" as used herein are parameters that are respectively related to one of the beam aberration coefficients and that can be extracted from defocus beam cross sections of a charged particle beam, particularly from an over-focused and an under-focused beam cross section of a charged particle beam. At specific defocus settings (for given NA and $E_L$ at a specific distance from the beam focus), there will typically be a defined one-to-one correspondence between a beam aberration coefficient and the corresponding aberration characteristic. For example, the aberration characteristics can be defined in accordance with the "digitized aberrations" of section 6.2 of UNO (see formulas (38)-(47)), but the present disclosure is not limited thereto. For example, the aberration characteristics could have additional factors or could be calculated based on interpolations or averaging from several pairs of under-focused and over-focused beam cross sections, respectively. At least some of the aberration characteristics could also be defined based on other defocus settings, i.e. not necessarily utilizing one over-focused and one under-focused beam cross section for the retrieval. Specifically, the aberration characteristics are defined such that the values of the aberration characteristics can be retrieved from one or more defocus beam cross sections of the charged particle beam and such that there is a relation (particularly a one-to-one correspondence in a range of interest) between the beam aberration coefficients and the respective aberration characteristics, provided that at least some parameters (such as NA, $E_L$ and/or the defocus settings at which the beam cross sections are taken or simulated) are maintained.

In some embodiments, each of the two or more values $(\sim_{x1}C_1, \sim_{x2}C_1)$ of the first aberration characteristic $\sim C_1$ is extracted from an over-focused beam cross section and the corresponding under-focused beam cross section. For example, in the embodiment depicted in FIG. 2, the first value $(\sim_{x1}C_1)$ is extracted from the over-focused beam cross section $g_{o-1}$ and the corresponding under-focused beam cross section $g_{u-1}$ that are respectively simulated with the first value $(_{x1}C_1)$ of the first beam aberration coefficient. Accordingly, first dependency $f_1$ maps the first value $(_{x1}C_1)$ of the first beam aberration coefficient to the first value $(\sim_{x1}C_1)$ of the first aberration characteristic. The second value $(\sim_{x2}C_1)$ of the first aberration characteristic can be determined analogously, such that at least two value pairs of the first dependency $f_1$: $C_1 \to \sim C_1$ are determined in stage (b.).

In some embodiments, which can be combined with other embodiments described herein, one, two or more radial line profiles are determined from each of the plurality of first simulated beam cross sections, and the two or more values of the first aberration characteristic are calculated based on said radial line profiles. A "radial line profile" as used herein relates to a radial intensity profile that can be extracted from a beam cross section, specifically the spot intensity along a certain azimuthal angle, obtainable for example via a 2-dimensional interpolation or by averaging over azimuthal angles.

The determination of radial line profiles from each of the plurality of first simulated beam cross sections is illustrated by box 220 in FIG. 2. For example, one or more radial line profiles $p_{o-1}$ (here: four radial line profiles at four different angles through the center of the respective beam profile) may be determined from the over-focused beam cross section $g_{o-1}$, and one or more radial line profiles $p_{o-1}$ (here: four radial line profiles at four different angles through the center of the respective beam profile) may be determined from the under-focused beam cross section $g_{u-1}$. The first aberration characteristic can be calculated from the one or more radial line profiles determined from a pair of over-focused and under-focused beam profiles.

In particular, N radial line profiles, N being a positive integer that may optionally be chosen depending on the symmetry of the aberration coefficient to be analyzed, may be determined from each of the plurality of simulated beam cross sections around the center of the respective simulated beam cross section at constant angular steps of $\theta_k = k\pi/N$, $k=0 \ldots (N-1)$. In the exemplary embodiment of FIG. 2, N=4, such that $\theta_1=0°$, $\theta_2=45°$, $\theta_3=90°$, $\theta_4=135°$. In other embodiments, N may be smaller or larger than 4. For example, if $C_1=C_{df}$, N may be chosen to be 1, because the beam profile is rotationally symmetric in the case of a defocus aberration.

In some embodiments, which can be combined with other embodiments described herein, any one or more of a beam width value ($\sigma$), an asymmetry value ($\mu$), and a curvature value ($\rho$) may be retrieved from each of the one, two or more radial line profiles, and the two or more values of the first aberration characteristic may be calculated based on the any one or more of the beam width value ($\sigma$), the asymmetry value ($\mu$), and/or the curvature value ($\rho$). In particular, the beam width value ($\sigma$), the asymmetry value ($\mu$) and/or the curvature value ($\rho$) may be calculated as follows:

$$\sigma = \sqrt{\frac{1}{W}\sum_j j^2 p_j}$$ [Formulas 1]

$$\mu = \frac{1}{W}\sum_j j p_j$$

$$\rho = \frac{\sigma^2}{T}\sum_{j \neq 0}\frac{1}{|j|}(p_j - p_0)p_j$$

wherein j denotes the radial position in the respective line profile (j=0 corresponds to the center of the beam profile), pj denotes the intensity at the radial position j, and $W=\Sigma_j p_j$ and $T=\Sigma_j p_j^2$.

In the embodiment depicted in FIG. 2 (with $C_1=C_s$), the curvature value may be calculated for each of the previously determined radial line profiles of each under-focused and over-focused beam cross section, and the two or more values $(\sim_{x1}C_1, \sim_{x2}C_1)$ of the first aberration characteristic may be respectively calculated based on the curvature values with the following formula:

$$\sim C_1 = \frac{1}{N}\sum_k (\rho_{u,k} - \rho_{o,k})$$ [Formula 2]

wherein the subscripts "u" and "o" mean under-focused beam cross section and corresponding over-focused beam cross section, and the subscript "k" means the kth line profile of the total of N line profiles per beam cross section.

In some embodiments, the two or more values $(\sim_{x1}C_1, \sim_{x2}C_1)$ of the first aberration characteristic may be determined with one of the following formulas (see box 230 of FIG. 2):

$$\begin{aligned}
\text{If } C_1 = C_{df} \quad &\sim C_1 = \frac{1}{N}\sum_k (\sigma_{u,k} - \sigma_{o,k}) \\
\text{If } C_1 = A_1 \quad &\sim C_1 = \frac{2}{N}\sum_k (\sigma_{u,k} - \sigma_{o,k})e^{2i\theta_k} \\
\text{If } C_1 = B_2 \quad &\sim C_1 = \frac{2}{N}\sum_k (\mu_{u,k} + \mu_{o,k})e^{i\theta_k} \\
\text{If } C_1 = A_2 \quad &\sim C_1 = \frac{2}{N}\sum_k (\mu_{u,k} + \mu_{o,k})e^{3i\theta_k} \\
\text{If } C_1 = C_s \quad &\sim C_1 = \frac{1}{N}\sum_k (\rho_{u,k} - \rho_{o,k})
\end{aligned}$$ [Formulas 3]

-continued

If $C_1 = S_3$    $\sim C_1 = \frac{2}{N}\sum_k (\rho_{u,k} - \rho_{o,k})e^{2i\theta_k}$ If $C_1 = A_3$    $\sim C_1 = \frac{2}{N}\sum_k (\sigma_{u,k} - \sigma_{o,k})e^{4i\theta_k}$ wherein the subscripts "u" and "o" mean under-focused beam cross section and corresponding over-focused beam cross section, and the subscript "k" means the kth line profile. However, as mentioned above, the definitions of the aberration characteristics are not limited thereto, and other equivalent definitions can be used.

After the determination of the two or more values ($\sim_{x1}C_1$, $\sim_{x2}C_1$) of the first aberration characteristic that are associated to the two or more different values ($_{x1}C_1$,$_{x2}C_1$) of the first beam aberration coefficient, the first dependency $f_1$ between the first beam aberration coefficient $C_1$ and the first aberration characteristic $\sim C_1$ is determined (stage (c.)), illustrated by box 240 of FIG. 2.

In some embodiments, which can be combined with other embodiments described herein, the first dependency $f_1$ between the first beam aberration coefficient $C_1$ and the first aberration characteristic $\sim C_1$ is an essentially linear dependency characterized by a scaling coefficient (corresponding to the slope in the linear graph of FIG. 2, or the inverse slope of the respective inverse function), and stage (c.) may include the determination of said scaling coefficient. Further, the y-intercept of the graph may be determined, such that the first dependency $f_1$ is fully defined. Determining the first dependency may particularly include the determination (and optionally storage in a memory) of the scaling coefficient that corresponds to a calibration factor between the first beam aberration coefficient and the first aberration characteristic. Since a linear dependency corresponds to one-to-one function, knowledge of the first dependency $f_1$, particularly knowledge of the slope (or inverse slope) or scaling coefficient, enables the determination of an actual value of the first aberration coefficient $C_1$, if a retrieved value of the first aberration characteristic $\sim C_1$ retrieved from an actual beam profile is available.

If the first dependency $f_1$ is not completely or not substantially linear, more than two value pairs respectively including a first beam aberration coefficient and the corresponding first aberration characteristic can be retrieved by simulations in analogy to the two value pairs above, such that also non-linear dependencies can be determined with a predetermined accuracy that may depend on the number of value pairs retrieved by respective simulations.

In some embodiments, which can be combined with other embodiments described herein, the first dependency $f_1$ may be stored in a memory of the charged particle beam system. In particular, the first dependency $f_1$ may be an essentially linear dependency that is characterized by the first scaling coefficient, and at least the first scaling coefficient may be stored in the memory of the charged particle beam system. The linear dependency can (later) be used for determining an actual value of the first beam aberration coefficient based on a retrieved value of the first aberration characteristic.

Returning to FIG. 1, the charged particle beam system 100 according to embodiments described herein may include a processing unit 170 and a memory 171, wherein the first dependency $f_1$ between the first beam aberration coefficient and the first aberration characteristic may be stored in the memory 171, e.g. by storing any one or more of the scaling coefficient, any of the value pairs ($_{x1}C_1$, $\sim_{x1}C_1$) and/or ($_{x2}C_1$, $\sim_{x2}C_1$) and/or an y-intercept of the determined linear function, such that the first dependency is fully defined. The first dependency $f_1$ allows the determination of an actual value of the first beam aberration coefficient, if a value of the first aberration characteristic retrieved from actual defocus images is available.

In some embodiments, further dependencies $f_{1\ldots n}$ between further beam aberration coefficients and the respective aberration characteristics determined in analogy to the first dependency $f_1$ can be determined and/or stored in the memory 171, enabling the determination of a set of actual beam aberration coefficients, if respective values of the aberration characteristics retrieved from taken defocus images is known. In particular, the memory 171 may store a plurality of dependencies between a set of beam aberration coefficients and a set of corresponding aberration characteristics.

The set of beam aberration coefficients, from which the first beam aberration coefficient $C_1$ is selected, may include any one or more of the following beam aberration coefficients: defocus ($C_{df}$), third-order spherical aberration ($C_s$), first-order astigmatism ($A_1$), second-order astigmatism ($A_2$), third-order astigmatism ($A_3$), second-order coma ($B_2$), third-order star aberration ($S_3$), and/or one or more chromatic aberration coefficients.

In the following, a method of determining an actual value $_{ac}C_1$ of the first beam aberration coefficient based on the first dependency $f_1$ is described with reference to FIG. 3.

Figure 3:
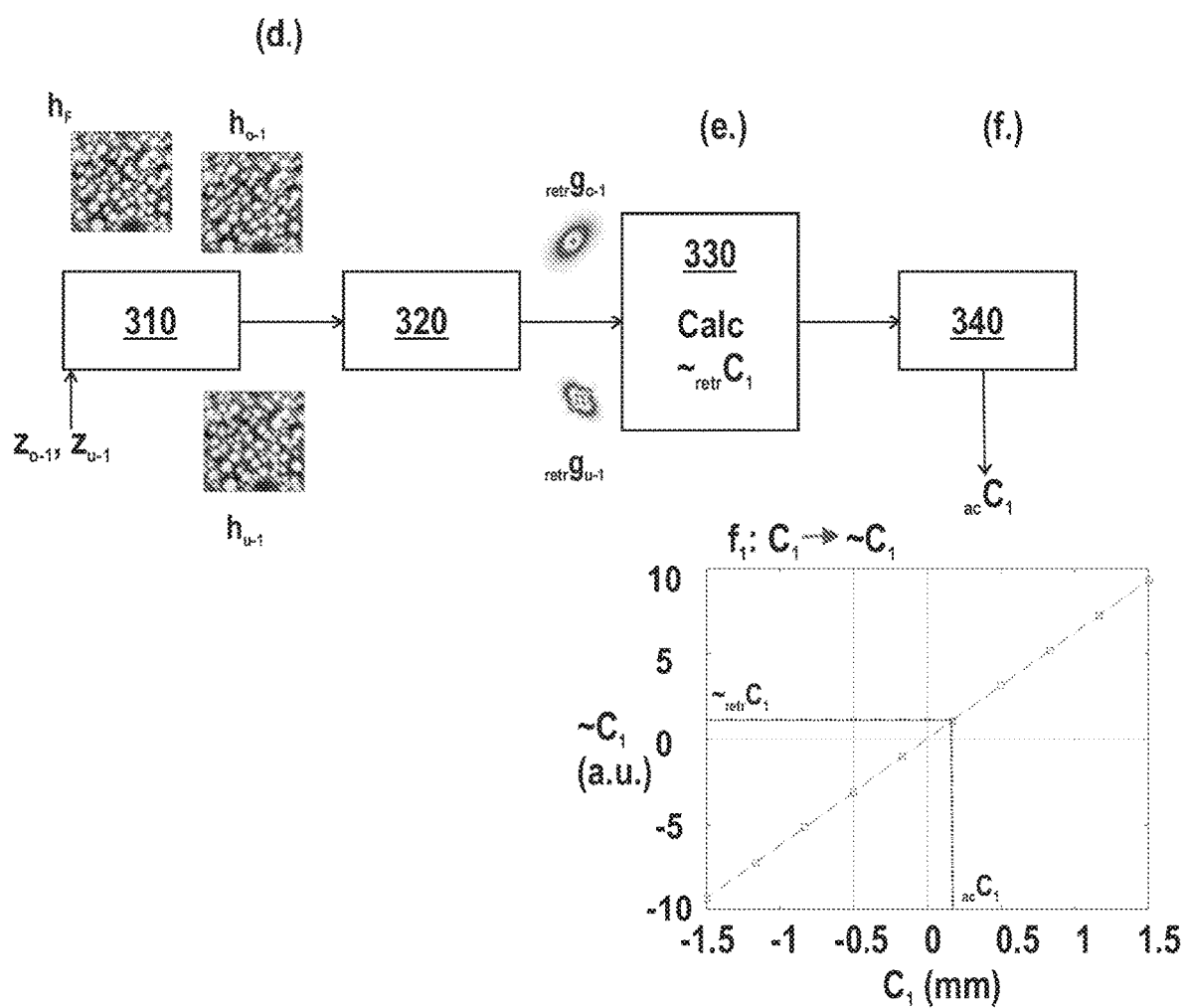
FIG. 3 shows a diagram illustrating a method of determining aberrations of a charged particle beam in a charged particle beam system according to embodiments described herein.

In box 310 of FIG. 3, one or more images of the sample are taken (stage (d.)) at the one or more first defocus settings to provide one or more taken images. The one or more first defocus settings at which the one or more images are taken in stage (d.) may correspond to the one or more first defocus settings at which the one or more beam cross sections are simulated in stage (a.). In particular, the one or more first defocus settings may include the one or more defocus distances ($z_{o-1}$, $z_{u-1}$) from a respective beam focus of the charged particle beam, such that the one or more images of the sample are taken when the sample is arranged at the one or more defocus distances from the beam focus, as it is schematically illustrated in FIG. 1. In an alternative method, the one or more images may be taken at one or more second defocus settings that are different from the one or more first defocus settings at which the one or more beam cross sections are simulated at stage (a.). However, the latter may require an interpolation based on at least two first dependencies determined at respective first defocus settings between the first beam aberration coefficient and the first aberration characteristic.

The one or more defocus distances ($z_{o-1}$, $z_{u-1}$), at which the images are taken in stage (d.) may correspond to the one or more defocus distances ($z_{o-1}$, $z_{u-1}$) at which the plurality of first simulated beam cross sections are simulated in stage (a.). In particular, the one or more images may be taken in stage (d.) with the numerical aperture, with the beam landing energy $E_L$, and at the one or more first defocus settings, at which the plurality of first simulated beam cross sections are simulated in stage (a.).

In some embodiments, which can be combined with other embodiments described herein, an over-focused image $h_{o-1}$ of the sample and an under-focused image $h_{u-1}$ of the sample may be taken, particularly when the sample is arranged at the first overfocus distance ($z_{o-1}$) from the beam focus and when the sample is arranged at the first underfocus distance ($z_{u-1}$) from the beam focus. FIG. 3 schematically shows an under-focused image ($h_{u-1}$) of the sample taken when the beam focus is located behind the sample by the first underfocus distance ($z_{u-1}$) and an over-focused image ($h_{o-1}$) of the sample taken when the beam focus is arranged in front of the sample by the first overfocus distance ($z_{o-1}$). Optionally, in some embodiments, also a focus image $h_F$ of the sample, i.e. a sharp sample image taken at the beam focus, may be taken, for example if the focus image of the sample is not otherwise available.

The defocus distance can be varied by varying a focusing strength of the focusing lens 120, e.g. in predetermined increments (as it is schematically illustrated in FIG. 1). Specifically, an increased focusing strength of the focusing lens 120 shifts the respective beam focus and the focal plane relative to the sample toward the focusing lens, and a decreased focusing strength shifts the respective beam focus and the focal plane relative to the sample away from the focusing lens, such that the defocus distance is varied. Alternatively or additionally, the defocus distance can be varied by moving the sample stage 108, e.g., in predetermined increments, particularly in the Z-direction (along the optical axis A), in particular while maintaining a constant focal strength provided by the focusing lens 120.

Alternatively or additionally, the one or more images may be taken at one or more beam landing energies of the charged particle beam varied from the focus beam landing energy, such that the one or more images of the sample are taken off-focus at the one or more varied beam landing energies. Also here, the one or more first defocus settings may correspond to the one or more first defocus settings at which the one or more beam cross sections are simulated in stage (a.), but the latter is not a necessary requirement, and the one or more images could also be taken at one or more second defocus settings different from the one or more first defocus settings. As mentioned above, simulating the beam cross sections in stage (a.) at the one or more varied beam landing energies and taking the defocus images at the one or more varied beam landing energies in stage (d.) is particularly beneficial, if the first beam aberration coefficient whose actual value is to be determined is a chromatic beam aberration coefficient.

A variation of the beam landing energy from the focus beam landing energy (for example, by varying the potential of the particle source (emitter) or of the sample (wafer bias)) may shift the beam focus away from the sample, such that a varied beam landing energy leads to a defocus image of the sample.

In box 320 of FIG. 3, one or more retrieved beam cross sections ($_{retr}g_{o-1}$, $_{retr}g_{u-1}$) are retrieved from the one or more taken images ($h_{o-1}$, $h_{u-1}$), i.e., one retrieved beam cross section from each of the one or more taken images. Accordingly, if an under-focused image and an over-focused image of the sample are taken, an under-focused retrieved beam cross section ($_{retr}g_{u}-1$) is retrieved from the under-focused image, and an over-focused retrieved beam cross section ($_{retr}g_{o}-1$) is retrieved from the over-focused image.

In some embodiments, which can be combined with other embodiments described herein, retrieving the one or more retrieved beam cross sections from the one or more images includes dividing the one or more images in Fourier space by a focus image of the sample in Fourier space. Alternatively, the retrieval of the one or more retrieved beam cross sections ($_{retr}g_{o-1}$, $_{retr}g_{u-1}$) from the one or more images ($h_{o-1}$, $h_{u-1}$) may be conducted in real space, particularly based on a deconvolution in real space, which is equivalent to a division in Fourier space.

As is illustrated by box 320 of FIG. 3, retrieving the one or more retrieved beam cross sections ($_{retr}g_{o-1}$, $_{retr}g_{u-1}$) from the one or more taken images ($h_{o-1}$, $h_{u-1}$) may specifically include Fourier transforming the one or more taken images in real space ($h_{o-1}$, $h_{u-1}$) to provide the one or more taken images in Fourier space ($H_{o-1}$, $H_{u-1}$), and dividing the one or more taken images in Fourier space ($H_{o-1}$, $H_{u-1}$) by the focus image of the sample in Fourier space ($H_F$). Said beam profile extraction method is based on the fact that, in Fourier space, dividing a taken defocus image ($H_{o-1}$) of a sample by the focus image ($H_F$) of the sample removes the structure of the sample, such that said division yields the pure beam profile ($G_{o-1}$), i.e. the beam cross section without sample information. The retrieved beam cross sections in Fourier space can then be inversely Fourier transformed for obtaining the one or more retrieved beam cross sections ($_{retr}g_{o-1}$, $_{retr}g_{u-1}$) in real space.

Retrieving the one or more retrieved beam cross sections ($_{retr}g_{o-1}$, $_{retr}g_{u-1}$) from the one or more taken images ($h_{o-1}$, $h_{u-1}$) may optionally include the application of a filter, in particular a multiplication with an adaptive filter term $G_{o-1,u-1}^{Filter}$, if the retrieval is done in Fourier space, or a convolution with an adaptive filter term, if the retrieval is done in real space. The adaptive filter term can be provided by an adaptive filter unit that may receive the taken images as an input information. An adaptive filter term may be provided individually for each of the taken images by the adaptive filter unit. Without the adaptive filter term, close-to-zero values of the focus image $H_F$ in the denominator of the above division may lead to an overly strong weight of noise in the image. The adaptive filter term reduces or avoids such unwanted effects of noise in the focus image $H_F$ in the calculation of the one or more retrieved beam cross sections, and a respective filter term may be determined in the adaptive filter unit for each of the taken images individually. Alternatively or additionally to the application of the adaptive filter term, retrieving the one or more retrieved beam cross sections from the one or more taken images may include a multiplication with a focus beam cross section in Fourier space $G_F$.

In box 330 of FIG. 3, a retrieved value $\sim_{retr}C_1$ of the first aberration characteristic is extracted (stage (e.)) from the one or more retrieved beam cross sections ($_{retr}g_{o-1}$, $_{retr}g_{u-1}$). In particular, the retrieved value $\sim_{retr}C_1$ of the first aberration characteristic may be retrieved from the under-focused retrieved beam cross section $_{retr}g_{u-1}$ and the over-focused retrieved beam cross section $_{retr}g_{u-1}$. In some embodiments, the retrieved value $\sim_{retr}C_1$ of the first aberration characteristic may be calculated using one of above [Formulas 1] and one or above [Formulas 3], particularly in analogy to the determination of the two or more values of the first aberration characteristic in stage (b.).

In particular, one or more radial line profiles may be determined from each of the one or more retrieved beam cross sections ($_{retr}g_{o-1}$, $_{retr}g_{u-1}$), and the retrieved value $\sim_{retr}C_1$ of the first aberration characteristic may be calculated based on said radial line profiles. Specifically, one or more of a beam width value, an asymmetry value, and a curvature value may be retrieved from each of the one or more radial line profiles, and the retrieved value $\sim_{retr}C_1$ of the first aberration characteristic may be calculated based thereon. In particular, the retrieved value $\sim_{retr}C_1$ of the first aberration characteristic may be calculated from the one or more retrieved beam cross sections ($_{retr}g_{o-1}$, $_{retr}g_{u-1}$) in a corresponding way as the calculation of the two or more values of the first aberration characteristic from the plurality of first simulated beam cross sections (see FIG. 2), such that reference can be made to the above explanations, which are not repeated here.

In box 340 of FIG. 3, the actual value $_{ac}C_1$ of the first beam aberration coefficient is determined (stage (f.)) based on the first dependency $f_1$ and based on the retrieved value of the first aberration characteristic $\sim_{retr}C_1$, particularly by calculating or interpolating the target value, to which $\sim_{retr}C_1$ is mapped by $f_1$ (or by the inverse of $f_1$, depending on how $f_1$ is defined).

Since the calibrations were done using absolute values of the first beam aberration coefficient for the simulations, the actual value $_{ac}C_1$ of the first beam aberration coefficient determined based on the first dependency $f_1$ corresponds to the absolute value of the first beam aberration coefficient, e.g., expressed in [mm].

In some embodiments, an aberration correction strength of one or more beam aberration correctors may be set based on the determined actual value $_{ac}C_1$ of the first beam aberration coefficient for correcting the first beam aberration.

In some embodiments, which can be combined with other embodiments described herein, a second dependency between a second beam aberration coefficient of the set of beam aberration coefficients and a second aberration characteristic, and optionally further dependencies between further beam aberration coefficients and respective further aberration characteristics may be determined correspondingly. In particular, a second dependency $f_2$ between a second beam aberration coefficient $C_2$ of the set of beam aberration coefficients $C_{1\ldots n}$ and a second aberration characteristic $\sim C_2$ may be determined in analogy to the first dependency $f_1$. The second dependency $f_2$ may be determined based on a plurality of second simulated beam cross sections $(g_{o-2}, g_{u-2})$ simulated off-focus for different values $(_{x1}C_2, _{x2}C_2)$ of the second beam aberration coefficient $C_2$ at the one or more first defocus settings, or alternatively at one or more other defocus settings. Reference is made to FIG. 2 and the respective explanations which apply analogously to the determination of the second dependency or of further dependencies. The second dependency and optional further dependencies may be stored in the memory 171 of the charged particle beam system, such that actual aberrations of the charged particle beam can then quickly be determined based on said stored dependencies.

In particular, after taking the one or more images of the sample and retrieving the one or more retrieved beam cross sections in stage (d.), a retrieved value of the second aberration characteristic $\sim_{retr}C_2$ and/or retrieved values of further aberration characteristics $\sim_{retr}C_{1\ldots n}$ may be extracted from the one or more retrieved beam cross sections in stage (e.), an actual value of the second beam aberration coefficient $_{ac}C_2$ may be determined based on the second dependency $f_2$ and based on the retrieved value of the second aberration characteristic $\sim_{retr}C_2$ in stage (f.), and/or actual values of further beam aberration coefficients $_{ac}C_{1\ldots n}$ may be determined based on the further dependencies $f_{1\ldots n}$ and based on the retrieved values of the further aberration characteristics $\sim_{retr}C_{1\ldots n}$ in stage (f.).

In embodiments described above, the one or more first defocus settings at which the one or more beam cross sections are simulated in stage (a.) correspond to the one or more first defocus settings at which the one or more images are taken in stage (d.). In alternative embodiments, the one or more defocus settings at which the one or more images are taken in stage (d.) are one or more second defocus settings different from the one or more first defocus settings at which the one or more beam cross sections are simulated in stage (a.). In said alternative embodiments, in stage (a.), the one or more beam cross sections may be simulated at two or more different first defocus settings, e.g. at different pairs of underfocus and overfocus distances, respectively. In stage (c.), at least two first dependencies $f_{1-1}$ and $f_{1-2}$ between the first aberration coefficient $C_1$ and the first aberration characteristic $\sim C_1$ are determined, each of the two first dependencies being based on associated first defocus settings.

If at least two first dependencies $f_{1-1}$ and $f_{1-2}$ that are based on different first defocus settings are available, the one or more images of the sample in stage (d.) can be taken at one or more (arbitrary) second defocus settings that may be different from the first defocus settings where the simulations took place. In stage (f), the actual value of the first beam aberration coefficient is then determined based on the at least two first dependencies $f_{1-1}$ and $f_{1-2}$ and based on the retrieved value $\sim_{retr}C_1$ of the first aberration characteristic, particularly using an interpolation.

It is to be noted that the stages (a.)-(f.) are not necessarily conducted in the specified sequence. For example, the one or more images of the sample at the one or more first defocus settings (stage (d.)) may be taken, before the simulations of the one or more beam cross sections (stage (a.)) are done, and the first dependency $f_1$ may be determined after taking the one or more images. The latter sequence may provide the advantage that the simulations can be conducted exactly at the first defocus settings of the actually taken images available from the settings of the charged particle beam system.

Specifically, the dependency between the beam aberration coefficient(s) and the respective aberration characteristic(s) via simulations can be determined before, during, or after taking the actual images of the sample. It may, however, be beneficial to determine the dependencies $f_{1\ldots n}$ (stages (a.)-(c.)) before determining the actual aberrations of the charged particle beam from the one or more defocus images (stages (d.)-(f)), because the simulations may be time-consuming. In particular, if the dependencies $f_{1\ldots n}$ are determined and are stored in a memory of the charged particle beam system before taking actual measurements, a quick and reliable determination of actual beam aberrations based on one or more taken defocus images becomes possible.

According to one aspect described herein, a charged particle beam system is described. The charged particle beam system includes a simulation unit configured to simulate one or more beam cross sections at one or more defocus settings for each of two or more different values of a first beam aberration coefficient $C_1$ to provide a plurality of first simulated beam cross sections, to extract two or more values of the first aberration characteristic from the plurality of first simulated beam cross sections, and to determine the first dependency between the first beam aberration coefficient $C_1$ and the first aberration characteristic $\sim C_1$ for use in determining an actual value of the first beam aberration coefficient. The first dependency $f_1$ between the first beam aberration coefficient and the first aberration characteristic may optionally be stored in a memory of the charged particle beam system for later use in determining beam aberrations according to the method described herein.

In some embodiments, which can be combined with other embodiments described herein, the memory stores instructions that, when executed by the processing unit, cause the charged particle beam system to retrieve one or more retrieved beam cross sections from one or more images taken at one or more defocus settings, to extract a retrieved value of the first aberration characteristic from the one or more retrieved beam cross sections, and to determine an actual value of the first beam aberration coefficient based on the first dependency and based on the retrieved value of the first aberration characteristic. The actual values of one or more further beam aberration coefficients can be determined analogously.

In some embodiments, the charged particle beam system further includes one or more aberration correctors, particularly one or more electrostatic and/or magnetic multipole correctors, configured to compensate aberrations of the charged particle beam based on the actual value of the first beam aberration coefficient or based on the actual values of further beam aberration coefficients determined analogously.

Embodiments described herein provide methods for the fast determination of aberration coefficients in a charged particle beam system in absolute values. The methods are based on the analysis of beam intensity distributions of beam cross sections for determining aberration characteristics and the calibration of said aberration characteristics using wave-optical simulations. Embodiments described herein enable the determination speed of line-profile based methods, while allowing the determination of absolute values of beam aberration coefficients. The combination of fast evaluation and absolute aberration values is a unique feature of the methods described herein. Methods described herein can be combined with fitting routines for validity checks and/or refinement of the determined beam aberration coefficients. Further, the determined absolute values allow for comparing performances between different tools.

In some embodiments, the determined actual value(s) of the beam aberration coefficient(s) can be used to simulate the focus beam cross section (i.e., the in-focus spot shape) of the actual charged particle beam of the charged particle beam system. Notably, the focus spot shape of a charged particle beam cannot easily be measured directly, but the methods described herein enable the simulation of the focal spot shape with a high accuracy. Beam spot shapes of different tools can be retrieved and compared, e.g., for improving the design of charged particle beam systems.

The analysis and determination of beam aberrations is a prerequisite to correcting and reducing detrimental effects either by design or via aberration correctors that may be parts of the charged particle beam systems described herein.

Specifically, the following embodiments are described herein:

Embodiment 1: A method of determining aberrations of a charged particle beam focused by a focusing lens with a given numerical aperture (NA) toward a sample in a charged particle beam system, comprising: (a.) simulating, based on the given numerical aperture (NA) and/or on a given beam landing energy ($E_L$), one or more beam cross sections at one or more first defocus settings for each of two or more different values ($_{x1}C_1$, $_{x2}C_1$) of a first beam aberration coefficient ($C_1$) of a set of beam aberration coefficients ($C_{1\ldots n}$), to provide a plurality of first simulated beam cross sections ($g_{o-1}$, $g_{u-1}$); (b.) extracting two or more values ($\sim_{x1}C_1$, $\sim_{x2}C_1$) of a first aberration characteristic ($\sim C_1$) that is related to the first beam aberration coefficient ($C_1$) from the plurality of first simulated beam cross sections; and (c.) determining a first dependency ($f_1$) between the first beam aberration coefficient ($C_1$) and the first aberration characteristic ($\sim C_1$). Optionally, the first dependency may be stored, e.g., in a memory associated to a processing unit, such as a computer.

The method may further comprise: (d.) taking one or more images of the sample at the one or more first defocus settings or at one or more second defocus settings, to provide one or more taken images ($h_{o-1}$, $h_{u-1}$), and retrieving one or more retrieved beam cross sections ($_{retr}g_{o-1}$, $_{retr}g_{u-1}$) from the one or more taken images; (e.) extracting a retrieved value ($\sim_{retr}C_1$) of the first aberration characteristic ($\sim C_1$) from the one or more retrieved beam cross sections; and (f.) determining an actual value of the first beam aberration coefficient based on the first dependency and based on the retrieved value of the first aberration characteristic.

Embodiment 2: The method of embodiment 1, wherein the one or more first defocus settings comprises one or more defocus distances ($z_{o-1}$, $z_{u-1}$) from a beam focus of the charged particle beam, such that, in (a.), the one or more beam cross sections are simulated at the one or more defocus distances ($z_{o-1}$, $z_{u-1}$) from the beam focus, and/or, in (d.), the one or more images of the sample are taken when the sample is arranged at the one or more defocus distances from the beam focus. In particular, in (a.), a pair of beam cross sections may be simulated for each of two or more different values of the first beam aberration coefficient, namely a respective over-focused beam cross section ($g_{o-1}$) at an overfocus distance ($z_{o-1}$) from the beam focus, i.e. on a first side of the beam focus, and a respective under-focused beam cross section ($g_{u-1}$) at an underfocus distance ($z_{u-1}$) from the beam focus, i.e., on a second side of the beam focus at a corresponding distance therefrom. In (d.), the one or more images of the sample may be taken when the sample is arranged at an overfocus distance ($z_{o-1}$) and when the sample is arranged at an underfocus distance ($z_{u-1}$) from the beam focus.

In some embodiments, taking the one or more images of the sample at one or more defocus distances in (d.) may include varying a focusing strength of a focusing lens of the charged particle beam system, or alternatively varying a distance between the focusing lens and the sample, e.g. via a stage movement.

Embodiment 3: The method of embodiment 1 or 2, wherein (a.) comprises simulating an over-focused beam cross section ($g_{o-1}$) and an under-focused beam cross section ($g_{u-1}$) for each of the two or more different values of the first beam aberration coefficient, and/or (b.) comprises extracting each of the two or more values of the first aberration characteristic from one of the over-focused beam cross sections and the corresponding under-focused beam cross section.

The over-focused beam cross sections may be simulated at an overfocus distance, i.e. on a first side at a positive distance from the beam focus, and the under-focused beam cross sections may be simulated at a corresponding underfocus distance, i.e. on a second side at a negative distance from the beam focus, wherein the absolute values of the positive and negative distances may be the same.

Embodiment 4: The method of any of embodiments 1 to 3, wherein (d.) comprises taking an under-focused image of the sample and an over-focused image of the sample, and retrieving an under-focused retrieved beam cross section from the under-focused image and an over-focused retrieved beam cross section from the over-focused image, and/or (e.) comprises extracting the retrieved value of the first aberration characteristic from the under-focused retrieved beam cross section and the over-focused retrieved beam cross section. In particular, the under-focused image of the sample may be taken when the sample is arranged off-focus at the under-focus distance from the beam focus, and the over-focused image may be taken when the sample is arranged off-focus at the overfocus distance from the beam focus, the underfocus distance and the overfocus distance having same absolute amounts but different signs.

Embodiment 5: The method of any of embodiments 1 to 4, wherein, in (b.), one or more radial line profiles are determined from each of the plurality of first simulated beam cross sections, and the two or more values of the first aberration characteristic are calculated based on said one or more radial line profiles. In particular, N radial line profiles, N being a positive integer that may be chosen depending on the symmetry of the aberration coefficient to be analyzed, may be determined from each of the plurality of simulated beam cross sections around the center of the respective simulated beam cross section at constant angular steps of $\theta_k = k\pi/N$, $k = 0 \ldots (N-1)$.

Embodiment 6: The method of embodiment 5, wherein a beam width value ($\sigma$), an asymmetry value ($\mu$), and/or a curvature value ($\rho$) is retrieved from each of the one or more radial line profiles, and the two or more values of the first aberration characteristic are calculated based thereon. In particular, the beam width value ($\sigma$), the asymmetry value ($\mu$) and/or the curvature value ($\rho$) may be calculated based on above [Formulas 1].

In some embodiments, the two or more values of the first aberration characteristic ($\sim_{x1} C_1$, $\sim_{x2} C_1$) may be determined based on one or above [Formulas 3], depending on what type of beam aberration the first beam aberration coefficient $C_1$ refers to.

Embodiment 7: The method of any of embodiments 1 to 7, wherein the set of beam aberration coefficients ($C_{1 \ldots n}$) comprises: defocus ($C_{df}$), third-order spherical aberration ($C_s$), first-order astigmatism ($A_1$), second-order astigmatism ($A_2$), third-order astigmatism ($A_3$), second-order coma ($B_2$), third-order star aberration ($S_3$), and one or more chromatic aberrations ($C_c$). The first beam aberration coefficient $C_1$ may be any of the beam aberration coefficients of said set of beam aberration coefficients.

Embodiment 8: The method of any of embodiments 1 to 7, wherein the first dependency between the first beam aberration coefficient ($C_1$) and the first aberration characteristic ($\sim C_1$) is an essentially linear dependency characterized by a scaling coefficient, and (c.) comprises determining said scaling coefficient.

Embodiment 9: The method of any of embodiments 1 to 8, wherein, in (d.), retrieving the one or more retrieved beam cross sections from the one or more images comprises dividing the one or more images in Fourier space by a focus image of the sample in Fourier space. Optionally, retrieving the one or more retrieved beam cross sections from the one or more images may further include at least one of a multiplication with an adaptive filter term and/or a multiplication with a focus beam cross section in Fourier space. In alternative embodiments, the one or more retrieved beam cross sections may be retrieved from the one or more images based on a deconvolution in real space.

Embodiment 10: The method of any of embodiments 1 to 9, further comprising determining a second dependency between a second beam aberration coefficient ($C_2$) of the set of beam aberration coefficients ($C_{1 \ldots n}$) and a second aberration characteristic ($\sim C_2$), particularly wherein the second dependency is determined based on a plurality of second simulated beam cross sections simulated for different values of the second beam aberration coefficient ($C_2$). Optionally, one or more further dependencies between one or more further beam aberration coefficients and one or more further aberration characteristics may be determined.

Embodiment 11: The method of embodiment 10, further comprising extracting a retrieved value of the second aberration characteristic from the one or more retrieved beam cross sections, and optionally extracting a retrieved value of at least one further aberration characteristic from the one or more retrieved beam cross sections; and determining an actual value of the second beam aberration coefficient based on the second dependency and based on the retrieved value of the second aberration characteristic, and optionally determining an actual value of the at least one further beam aberration coefficient based on the at least one further dependency and the retrieved value of the at least one further aberration characteristic.

Embodiment 12: The method of any of embodiments 1 to 11, further comprising storing the first dependency in a memory of the charged particle beam system, particularly wherein the first dependency is an essentially linear dependency characterized by a first scaling coefficient that is stored in the memory. Further dependences between further beam aberration coefficients of the set of beam aberration coefficients and respective aberration characteristics may be determined in analogy to the first dependency in stages (a.)-(c.), and may optionally be stored in the memory as well.

Embodiment 13: The method of any of embodiments 1 to 12, wherein, in (c.), at least two first dependencies between the first beam aberration coefficient ($C_1$) and the first aberration characteristic are determined, each first dependency being based on associated first defocus settings, particularly each first dependency being based on a respective pair of an over-focused beam cross section and an under-focused beam cross section; in (d.), the one or more images of the sample are taken at the one or more second defocus settings different from the one or more first defocus settings; and, in (f.), the actual value of the first beam aberration coefficient is determined based on the at least two first dependencies and based on the retrieved value of the first aberration characteristic, particularly using an interpolation.

Embodiment 14: The method of any of embodiments 1 to 13, wherein the one or more first defocus settings comprise one or more beam landing energies of the charged particle beam varied from a focus beam landing energy, such that, in (a.), the one or more beam cross sections are simulated off-focus at the one or more beam landing energies, and, in (d.), the one or more images of the sample are taken off-focus at the one or more beam landing energies. In some embodiments, one or more beam cross sections are simulated off-focus at one or more different defocus distances and one or more beam cross sections are simulated off-focus at one or more different beam landing energies. Dependencies between "chromatic" aberration coefficients and the respective aberration characteristics can be determined in addition to dependencies between "geometric" aberration coefficients and the respective aberration characteristics.

Embodiment 15: The method of any of embodiments 1 to 14, further comprising setting an aberration correction strength of one or more beam aberration correctors based on the actual value of the first beam aberration coefficient, and optionally based on actual values of further beam aberration coefficients determined in analogy to the actual value of the first beam aberration coefficient.

Embodiment 16: A method of determining aberrations of a charged particle beam focused by a focusing lens with a given numerical aperture (NA) toward a sample in a charged particle beam system, comprising: simulating, based at least on the given numerical aperture (NA), one or more beam cross sections at one or more first defocus settings for each of two or more different values of a first beam aberration coefficient ($C_1$) of a set of beam aberration coefficients ($C_{1 \ldots n}$), to provide a plurality of first simulated beam cross sections; extracting two or more values of a first aberration characteristic that is related to the first beam aberration coefficient ($C_1$) from the plurality of first simulated beam cross sections; determining a first dependency between the first beam aberration coefficient ($C_1$) and the first aberration characteristic; and storing the first dependency in a memory for subsequent use in determining an actual value of the first beam aberration coefficient. The embodiment 16 may be combined with or may additionally include the features of any of above-mentioned embodiments 1 to 15.

Embodiment 17: A charged particle beam system, in particular a charged particle beam system configured to conduct any of the methods described herein, comprising: a charged particle source for emitting a charged particle beam propagating along an optical axis; a sample stage; a focusing lens for focusing the charged particle beam with a given numerical aperture (NA) toward a sample placed on the sample stage; a charged particle detector for detecting signal particles emitted from the sample; and a processing unit and a memory. The memory stores a first dependency between a first beam aberration coefficient ($C_1$) and a first aberration characteristic (~$C_1$), the first aberration characteristic being a parameter that has a predetermined relation to the first beam aberration coefficient and is extractable from one or more defocus beam cross-sections.

Embodiment 18: The charged particle beam system of embodiment 17, wherein the memory stores instructions that, when executed by the processing unit, cause the charged particle beam system to retrieve one or more retrieved beam cross sections from one or more images taken at one or more defocus settings; to extract a retrieved value of the first aberration characteristic from the one or more retrieved beam cross sections; and to determine an actual value of the first beam aberration coefficient based on the first dependency and based on the retrieved value of the first aberration characteristic.

Embodiment 19: The charged particle beam system of embodiment 17 or 18, further comprising one or more aberration correctors, particularly one or more electrostatic or magnetic multipole correctors, configured to compensate aberrations of the charged particle beam based on the actual value of the first beam aberration coefficient.

Embodiment 20: The charged particle beam system of any of embodiments 17 to 19, wherein the memory stores a plurality of dependencies between a set of beam aberration coefficients and a set of corresponding aberration characteristics.

Embodiment 21: The charged particle beam system of any of embodiments 18 to 20, wherein the one or more defocus settings comprise one or more defocus distances of the sample from a respective beam focus of the charged particle beam, when the one or more images are taken, particularly an underfocus distance and a corresponding overfocus distance.

Embodiment 22: The charged particle beam system of any of embodiments 18 to 21, wherein the one or more defocus settings comprise one or more beam landing energies of the charged particle beam varied from a focus beam landing energy, when the one or more images are taken.

Embodiment 23: A charged particle beam system, particularly in accordance with any of embodiments 17 to 22, comprising a simulation unit configured to simulate one or more beam cross sections at one or more defocus settings for each of two or more different values of a first beam aberration coefficient ($C_1$) to provide a plurality of first simulated beam cross sections, to extract two or more values of the first aberration characteristic from the plurality of first simulated beam cross sections, and to determine the first dependency between the first beam aberration coefficient ($C_1$) and the first aberration characteristic (~$C_1$) for use in determining an actual value of the first beam aberration coefficient. The charged particle beam system may further include any of the features of the embodiments described herein and/or may be configured for conducting any of the methods described herein.

While the foregoing is directed to embodiments, other and further embodiments may be devised without departing from the basic scope thereof, and the scope thereof is determined by the claims that follow.

The invention claimed is:

1. A method of determining aberrations of a charged particle beam focused by a focusing lens with a given numerical aperture toward a sample in a charged particle beam system, comprising:
   (a.) simulating, based at least on the given numerical aperture, one or more beam cross sections at one or more first defocus settings for each of two or more different values of a first beam aberration coefficient of a set of beam aberration coefficients, to provide a plurality of first simulated beam cross sections;
   (b.) extracting two or more values of a first aberration characteristic that is related to the first beam aberration coefficient from the plurality of first simulated beam cross sections;
   (c.) determining a first dependency between the first beam aberration coefficient and the first aberration characteristic;
   (d.) taking one or more images of the sample at the one or more first defocus settings or at one or more second defocus settings, to provide one or more taken images, and retrieving one or more retrieved beam cross sections from the one or more taken images;
   (e.) extracting a retrieved value of the first aberration characteristic from the one or more retrieved beam cross sections; and
   (f.) determining an actual value of the first beam aberration coefficient based on the first dependency and based on the retrieved value of the first aberration characteristic.

2. The method according to claim 1, wherein the one or more first defocus settings comprise one or more defocus distances from a beam focus of the charged particle beam, such that, in (a.), the one or more beam cross sections are simulated at the one or more defocus distances from the beam focus, and, in (d.), the one or more images of the sample are taken when the sample is arranged at the one or more defocus distances from the beam focus.

3. The method according to claim 1, wherein (a.) comprises simulating an over-focused beam cross section and an under-focused beam cross section for each of the two or more different values of the first beam aberration coefficient, and (b.) comprises extracting each of the two or more values of the first aberration characteristic from one of the over-focused beam cross sections and the corresponding under-focused beam cross section.

4. The method according to claim 1, wherein (d.) comprises taking an under-focused image of the sample and an over-focused image of the sample, and retrieving an under-focused retrieved beam cross section from the under-focused image and an over-focused retrieved beam cross section from the over-focused image, and (e.) comprises extracting the retrieved value of the first aberration characteristic from the under-focused retrieved beam cross section and the over-focused retrieved beam cross section.

5. The method according to claim 1, wherein, in (b.), one or more radial line profiles are determined from each of the plurality of first simulated beam cross sections, and the two or more values of the first aberration characteristic are calculated based on said radial line profiles.

6. The method according to claim 5, wherein one or more of a beam width value, an asymmetry value, and a curvature value is retrieved from each of the one or more radial line profiles, and the two or more values of the first aberration characteristic are calculated based thereon.

7. The method according to claim 1, wherein the first beam aberration coefficient is selected from the set of beam aberration coefficients comprising defocus ($C_{df}$), third-order spherical aberration ($C_s$), first-order astigmatism ($A_1$), second-order astigmatism ($A_2$), third-order astigmatism ($A_3$), second-order coma ($B_2$), third-order star aberration ($S_3$), and one or more chromatic aberrations ($C_c$).

8. The method according to claim 1, wherein the first dependency between the first beam aberration coefficient and the first aberration characteristic is an essentially linear dependency characterized by a first scaling coefficient, and (c.) comprises determining said first scaling coefficient.

9. The method according to claim 1, wherein, in (d.), retrieving the one or more retrieved beam cross sections from the one or more images comprises dividing the one or more images in Fourier space by a focus image of the sample in Fourier space, or alternatively wherein the one or more retrieved beam cross sections are retrieved based on a deconvolution in real space.

10. The method according to claim 1, further comprising determining a second dependency between a second beam aberration coefficient of the set of beam aberration coefficients and a second aberration characteristic, particularly wherein the second dependency is determined based on a plurality of second simulated beam cross sections simulated for different values of the second beam aberration coefficient.

11. The method according to claim 10, further comprising:
    extracting a retrieved value of the second aberration characteristic from the one or more retrieved beam cross sections; and
    determining an actual value of the second beam aberration coefficient based on the second dependency and based on the retrieved value of the second aberration characteristic.

12. The method according to claim 1, further comprising storing the first dependency in a memory of the charged particle beam system, particularly wherein the first dependency is an essentially linear dependency characterized by a first scaling coefficient that is stored in the memory.

13. The method according to claim 1, wherein, in (c.), at least two first dependencies between the first beam aberration coefficient and the first aberration characteristic are determined, each first dependency being based on associated first defocus settings;
    in (d.), the one or more images of the sample are taken at the one or more second defocus settings different from the one or more first defocus settings; and
    in (f.), the actual value of the first beam aberration coefficient is determined based on the at least two first dependencies and based on the retrieved value of the first aberration characteristic.

14. The method according to claim 1, wherein the one or more first defocus settings comprise one or more beam landing energies of the charged particle beam varied from a focus beam landing energy, such that, in (a.), the one or more beam cross sections are simulated off-focus at the one or more beam landing energies, and, in (d.), the one or more images of the sample are taken off-focus at the one or more beam landing energies.

15. The method according to claim 1, further comprising setting an aberration correction strength of one or more beam aberration correctors based on the actual value of the first beam aberration coefficient.

16. A method of determining aberrations of a charged particle beam focused by a focusing lens with a given numerical aperture toward a sample in a charged particle beam system, comprising:
    (a.) simulating, based at least on the given numerical aperture, one or more beam cross sections at one or more first defocus settings for each of two or more different values of a first beam aberration coefficient to provide a plurality of first simulated beam cross sections;
    (b.) extracting two or more values of a first aberration characteristic that is related to the first beam aberration coefficient from the plurality of first simulated beam cross sections; and
    (c.) determining a first dependency between the first beam aberration coefficient and the first aberration characteristic for use in determining an actual value of the first beam aberration coefficient.

17. A charged particle beam system, comprising:
    a charged particle source for emitting a charged particle beam propagating along an optical axis;
    a sample stage;
    a focusing lens for focusing the charged particle beam with a given numerical aperture toward a sample placed on the sample stage;
    a charged particle detector for detecting signal particles emitted from the sample; and
    a processing unit and a memory storing a first dependency between a first beam aberration coefficient and a first aberration characteristic, the first aberration characteristic being a parameter that has a predetermined relation to the first beam aberration coefficient and is extractable from one or more defocus beam cross-sections.

18. The charged particle beam system according to claim 17, wherein the memory stores instructions that, when executed by the processing unit, cause the charged particle beam system to
    retrieve one or more retrieved beam cross sections from one or more images taken at one or more defocus settings;
    extract a retrieved value of the first aberration characteristic from the one or more retrieved beam cross sections; and
    determine an actual value of the first beam aberration coefficient based on the first dependency and based on the retrieved value of the first aberration characteristic.

19. The charged particle beam system according to claim 18, further comprising one or more aberration correctors, particularly one or more electrostatic or magnetic multipole correctors, configured to compensate aberrations of the charged particle beam based on the actual value of the first beam aberration coefficient.

20. The charged particle beam system according to claim 17, wherein the memory stores a plurality of dependencies between a set of beam aberration coefficients and a set of corresponding aberration characteristics.

21. The charged particle beam system according to claim 17, comprising a simulation unit configured to:

simulate one or more beam cross sections at one or more defocus settings for each of two or more different values of a first beam aberration coefficient to provide a plurality of first simulated beam cross sections;

extract two or more values of the first aberration characteristic from the plurality of first simulated beam cross sections; and determine the first dependency between the first beam aberration coefficient and the first aberration characteristic for use in determining an actual value of the first beam aberration coefficient.

\* \* \* \* \*